(12) United States Patent
Chen et al.

(10) Patent No.: US 10,921,378 B2
(45) Date of Patent: Feb. 16, 2021

(54) SYSTEM FOR MEASURING VOLTAGE DIFFERENCES BETWEEN BATTERY CELLS AND FOR OBTAINING BATTERY CELL VOLTAGES USING THE VOLTAGE DIFFERENCES

(71) Applicant: Ford Global Technologies, LLC, Dearborn, MI (US)

(72) Inventors: Chingchi Chen, Ann Arbor, MI (US); Benjamin A. Tabatowski-Bush, Ann Arbor, MI (US); John Paul Gibeau, Canton, MI (US); Kevin Vander Laan, Bloomfield Hills, MI (US); Baojin Wang, Ypsilanti, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 111 days.

(21) Appl. No.: 16/283,982

(22) Filed: Feb. 25, 2019

(65) Prior Publication Data

US 2020/0271728 A1   Aug. 27, 2020

(51) Int. Cl.
*G01R 31/396* (2019.01)
*G01R 31/3835* (2019.01)
*H02J 7/00* (2006.01)
*G01R 19/10* (2006.01)
*H01M 10/42* (2006.01)
(Continued)

(52) U.S. Cl.
CPC ......... *G01R 31/3835* (2019.01); *G01R 19/10* (2013.01); *G01R 19/16542* (2013.01); *G01R 31/396* (2019.01); *H01M 10/425* (2013.01);
*H02J 7/0014* (2013.01); *H02J 7/345* (2013.01); *H01M 2010/4271* (2013.01); *H01M 2220/20* (2013.01)

(58) Field of Classification Search
CPC .. G01R 31/3835; G01R 31/396; G01R 19/10; G01R 19/16542; H01M 10/425; H02J 7/0014; H02J 7/345; H02J 3/322; H02J 2310/48
See application file for complete search history.

(56) References Cited

U.S. PATENT DOCUMENTS 5,546,003 A * 8/1996 Noworolski ......... G01R 31/392
                                                            324/434
5,675,258 A * 10/1997 Kadouchi .......... G01R 31/3842
                                                            324/433
(Continued)

FOREIGN PATENT DOCUMENTS

JP        2001201522 A       7/2001

*Primary Examiner* — Patrick Assouad
*Assistant Examiner* — Demetrius R Pretlow
(74) *Attorney, Agent, or Firm* — David B. Kelley; Brooks Kushman P.C.

(57) ABSTRACT

A system for monitoring battery cells of a battery includes a capacitor, a processor, and a controller. The controller is configured to connect the capacitor with a first battery cell to charge the capacitor to a voltage of the first battery cell and then (i) connect the capacitor with a second battery cell to form a circuit having an output that is a voltage difference of the capacitor and the second battery cell and (ii) connect the output to the processor for the processor to measure the voltage difference. The voltage difference is the voltage difference between the first battery cell and the second battery cell.

20 Claims, 5 Drawing Sheets

(51) Int. Cl.
*H02J 7/34* (2006.01)
*G01R 19/165* (2006.01)

(56) References Cited

U.S. PATENT DOCUMENTS

| | | | | |
|---|---|---|---|---|
| 6,268,710 B1* | 7/2001 | Koga | | H02J 7/0021 |
| | | | | 320/116 |
| 8,432,132 B2 | 4/2013 | Nakanishi | | |
| 9,366,730 B2 | 6/2016 | Sano | | |
| 2002/0017895 A1* | 2/2002 | Kawashima | | H02J 7/0019 |
| | | | | 320/118 |
| 2005/0189949 A1* | 9/2005 | Shimizu | | G01R 31/3835 |
| | | | | 324/434 |
| 2006/0071643 A1* | 4/2006 | Carrier | | H02J 7/0021 |
| | | | | 320/132 |
| 2008/0164882 A1* | 7/2008 | Jaeger | | H02J 7/0021 |
| | | | | 324/434 |
| 2008/0265901 A1* | 10/2008 | Shimizu | | G01R 19/2503 |
| | | | | 324/434 |
| 2009/0295396 A1* | 12/2009 | Kouchi | | G01R 31/396 |
| | | | | 324/426 |
| 2010/0073004 A1* | 3/2010 | Miyamoto | | G01R 19/10 |
| | | | | 324/426 |
| 2011/0210747 A1* | 9/2011 | Heo | | B60L 58/22 |
| | | | | 324/434 |
| 2012/0253716 A1* | 10/2012 | Tsuchiya | | B60L 58/22 |
| | | | | 702/63 |
| 2013/0088202 A1* | 4/2013 | Kamata | | H02J 7/0016 |
| | | | | 320/126 |
| 2013/0265058 A1* | 10/2013 | Danner | | G01R 31/396 |
| | | | | 324/433 |
| 2014/0111160 A1* | 4/2014 | Nozawa | | G01R 31/3835 |
| | | | | 320/118 |
| 2014/0197841 A1* | 7/2014 | Mizoguchi | | G01R 31/396 |
| | | | | 324/434 |
| 2014/0239966 A1* | 8/2014 | Song | | G01R 31/396 |
| | | | | 324/434 |
| 2016/0091572 A1* | 3/2016 | Fujii | | G01R 19/16542 |
| | | | | 324/434 |
| 2017/0184678 A1* | 6/2017 | Sekiguchi | | G01R 35/00 |
| 2017/0244259 A1* | 8/2017 | Tsuchiya | | G01R 31/3835 |
| 2018/0212279 A1* | 7/2018 | Wang | | H01M 10/02 |
| 2018/0316197 A1* | 11/2018 | Zhang | | H01M 10/441 |
| 2019/0089179 A1* | 3/2019 | Kamibayashi | | H02J 7/0063 |
| 2019/0101596 A1* | 4/2019 | Sakakibara | | H02J 7/1423 |
| 2019/0293693 A1* | 9/2019 | Tsuchiya | | H02J 7/007 |
| 2020/0021118 A1* | 1/2020 | Wang | | H01M 10/425 |
| 2020/0059106 A1* | 2/2020 | Karlsson | | H01M 10/425 |
| 2020/0191845 A1* | 6/2020 | Friegel | | G01R 31/388 |

* cited by examiner

SYSTEM FOR MEASURING VOLTAGE DIFFERENCES BETWEEN BATTERY CELLS AND FOR OBTAINING BATTERY CELL VOLTAGES USING THE VOLTAGE DIFFERENCES

TECHNICAL FIELD

The present invention relates to monitoring voltages of battery cells.

BACKGROUND

An electric vehicle includes a traction battery having battery cells. The cell voltages are variables used to maintain safe and efficient vehicle operations. A battery energy control module ("BECM") monitors the cell voltages, battery current/voltage, and battery temperature. The BECM performs state estimations, cell balancing control, contactor controls, etc. Many BECM functions rely on accurate cell voltage sampling.

A BECM typically includes multiple battery monitoring integrated circuits ("BMICs"). A BMIC includes voltage measurement circuits, diagnostic circuits, cell balancing switches, etc. Ordinarily, a BMIC further includes a high-resolution analog-to-digital converter(s) ("ADC") (for example, up to 16 bits) for absolute cell voltage measurement and a high accuracy voltage reference. The high-resolution ADC requires an expensive trimming process to achieve high accuracy. The high-resolution ADC and high accuracy voltage reference with the associated trimming process lead to a high cost of the BMIC. Consequently, the cost of a BECM having multiple high cost BMICs is high.

SUMMARY

An embodiment provides a system having a capacitor, a processor, and a controller. The controller is configured to connect the capacitor with a cell to charge the capacitor to a voltage of the cell and then (i) connect the capacitor with a voltage source to form a circuit having an output that is a voltage difference of the capacitor and the voltage source and (ii) connect the output to the processor for the processor to measure the voltage difference. The cell may be a battery cell of a traction battery of a vehicle.

In an embodiment, the cell is a first cell and the voltage source is a second cell, whereby the voltage difference is the voltage difference between the first cell and the second cell. The processor may be configured to measure the voltage of the first cell based in part on the voltage difference between the first cell and the second cell.

In an embodiment, the system further includes a second capacitor and the controller is further configured to connect the second capacitor with a second cell to charge the second capacitor to a voltage of the second cell. In this case, the voltage source is the second capacitor charged to the voltage of the second cell, whereby the voltage difference is the voltage difference between the first cell and the second cell. The processor may be configured to measure the voltage of the first cell based in part on the voltage difference between the first cell and the second cell.

The controller may be further configured to connect the capacitor, after the capacitor has been charged to the voltage of the cell and prior to the capacitor being connected with the voltage source, to the processor for the processor to measure the voltage of the capacitor and thereby measure the voltage of the cell.

Another embodiment provides a system for monitoring battery cells of a battery. The system includes a first battery monitoring integrated circuit (BMIC) connected to the battery cells of a first portion of the battery and a second BMIC connected to the battery cells of a second portion of the battery. The first BMIC includes a first capacitor, a second capacitor, a processor, and a controller. The controller is configured to connect the first capacitor in parallel with a first battery cell connected to the first BMIC to charge the first capacitor to a voltage of the first battery cell and connect the second capacitor in parallel with a second battery cell connected to the first BMIC to charge the second capacitor to a voltage of the second battery cell and then (i) connect the first capacitor in series with the second capacitor to form a circuit having an output that is a voltage difference of the first capacitor and the second capacitor and (ii) connect the output to the processor for the processor to measure the voltage difference, whereby the voltage difference measured by the processor is the voltage difference between the first battery cell and the second battery cell. The second BMIC is further connected to a shared one of the battery cells of the first portion of the battery.

The second BMIC may include an analog-to-digital converter (ADC) having a resolution and is configured to measure an absolute voltage of any battery cell connected to the BMIC using the ADC. In this case, the first BMIC may lack any ADC having a resolution greater than the resolution of the ADC of the second BMIC and the first BMIC may be configured to measure the voltage of a given battery cell connected to the first BMIC as being a summation of (i) a voltage difference of the given battery cell and the shared one of the battery cells as measured by the first BMIC and (ii) the absolute voltage of the shared one of the battery cells as measured by the second BMIC.

The controller may be further configured to connect the first capacitor, after the first capacitor has been charged to the voltage of the first battery cell and prior to the first capacitor being connected in series with the second capacitor, to the processor for the processor to measure the voltage of the first capacitor and thereby measure the voltage of the first battery cell.

The second BMIC may include a third capacitor, a fourth capacitor, a second processor, and a second controller and may be configured to connect the third capacitor in parallel with a third battery cell connected to the second BMIC to charge the third capacitor to a voltage of the third battery cell and connect the fourth capacitor in parallel with a fourth battery cell connected to the second BMIC to charge the fourth capacitor to a voltage of the fourth battery cell and then (i) connect the third capacitor in series with the fourth capacitor to form a second circuit having a second output that is a voltage difference of the third capacitor and the fourth capacitor and (ii) connect the second output to the second processor for the second processor to measure the voltage difference, whereby the voltage difference measured by the processor is the voltage difference between the third battery cell and the fourth battery cell.

Another embodiment provides a vehicle having a traction battery and a first BMIC. The first BMIC is connected to battery cells of the traction battery. The first BMIC includes a capacitor, a processor, and a controller. The controller is configured to connect the capacitor in parallel with a first one of the battery cells to charge the capacitor to a voltage of the first one of the battery cells and then connect the capacitor in series with a voltage source to form a circuit having an output that is a voltage difference of the capacitor and the voltage source and connect the output to the processor for the processor to measure the voltage difference.

The vehicle may further include a second BMIC connected to a given one of the battery cells and configured to measure an absolute voltage of the given one of the battery cells.

The first BMIC may be configured to, responsive to the voltage difference being greater than a cell balancing threshold, balance the battery cells of the battery.

The vehicle may further include a vehicle controller configured to, responsive to the voltage difference being greater than a shutdown threshold, disconnect the battery from a load.

DETAILED DESCRIPTION

Detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
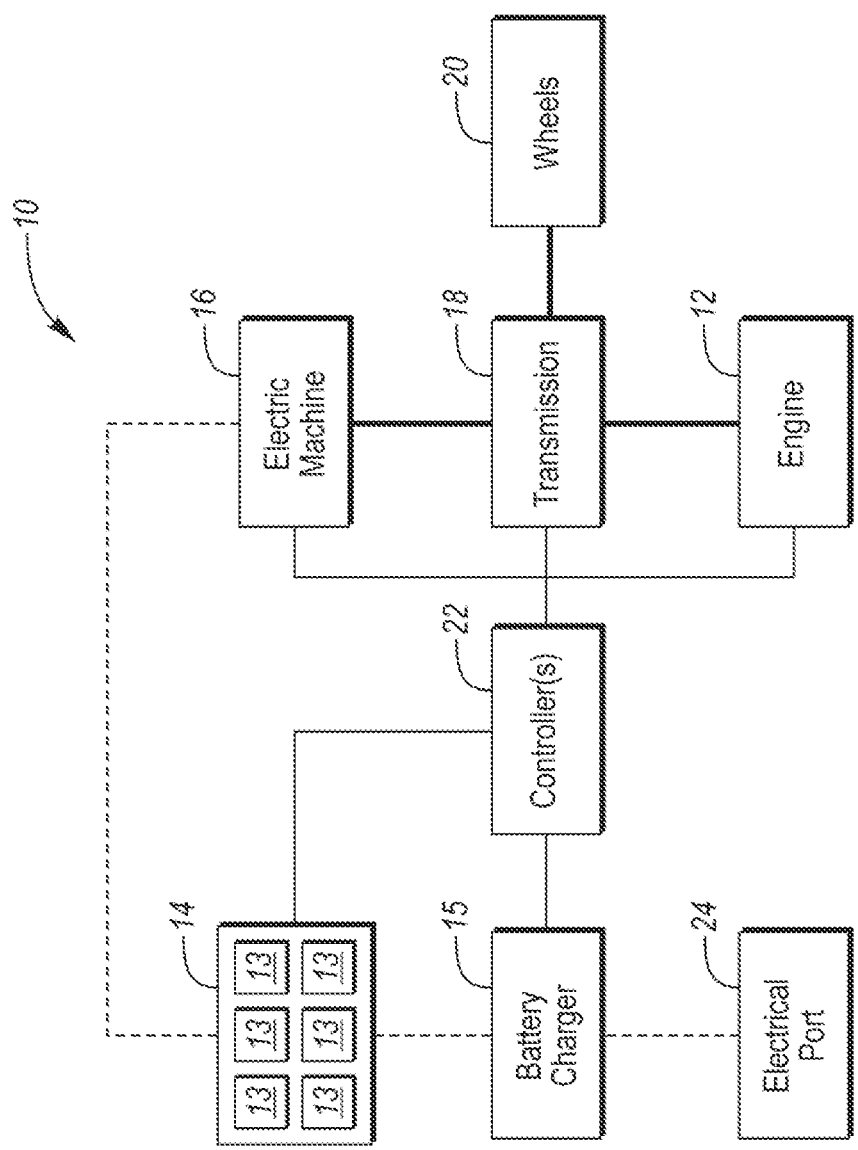
FIG. 1 illustrates a block diagram of an electric vehicle.

Referring now to FIG. 1, an embodiment of an electric vehicle 10 is shown. Electric vehicle 10 is, for example, a plug-in hybrid electric vehicle (PHEV). Electric vehicle 10 includes an engine 12, a traction battery 14 having a plurality of battery cells 13, a battery charger 15, and an electric machine 16. Electric vehicle 10 also includes a transmission 18, wheels 20, a vehicle controller(s) 22, and an electrical port 24. Engine 12, electric machine 16, and wheels 20 are mechanically connected with transmission 18 (as indicated by thick lines) in any suitable/known fashion such that engine 12 and/or electric machine 16 may drive wheels 20, engine 12 and/or wheels 20 may drive electric machine 16, and electric machine 16 may drive engine 12. Battery 14 may provide energy to or receive energy from electric machine 16 (as indicated by dashed line). Battery 14 may also receive energy from a utility grid or other electrical source (not shown) via electrical port 24 and battery charger 15 (as indicated by dashed line). Controller 22 is in communication with and/or controls engine 12, battery 14, battery charger 15, electric machine 16, and transmission 18 (as indicated by thin lines). Other electric vehicle configurations, such as a battery electric vehicle (BEV) configuration, etc., are possible.

Figure 2:
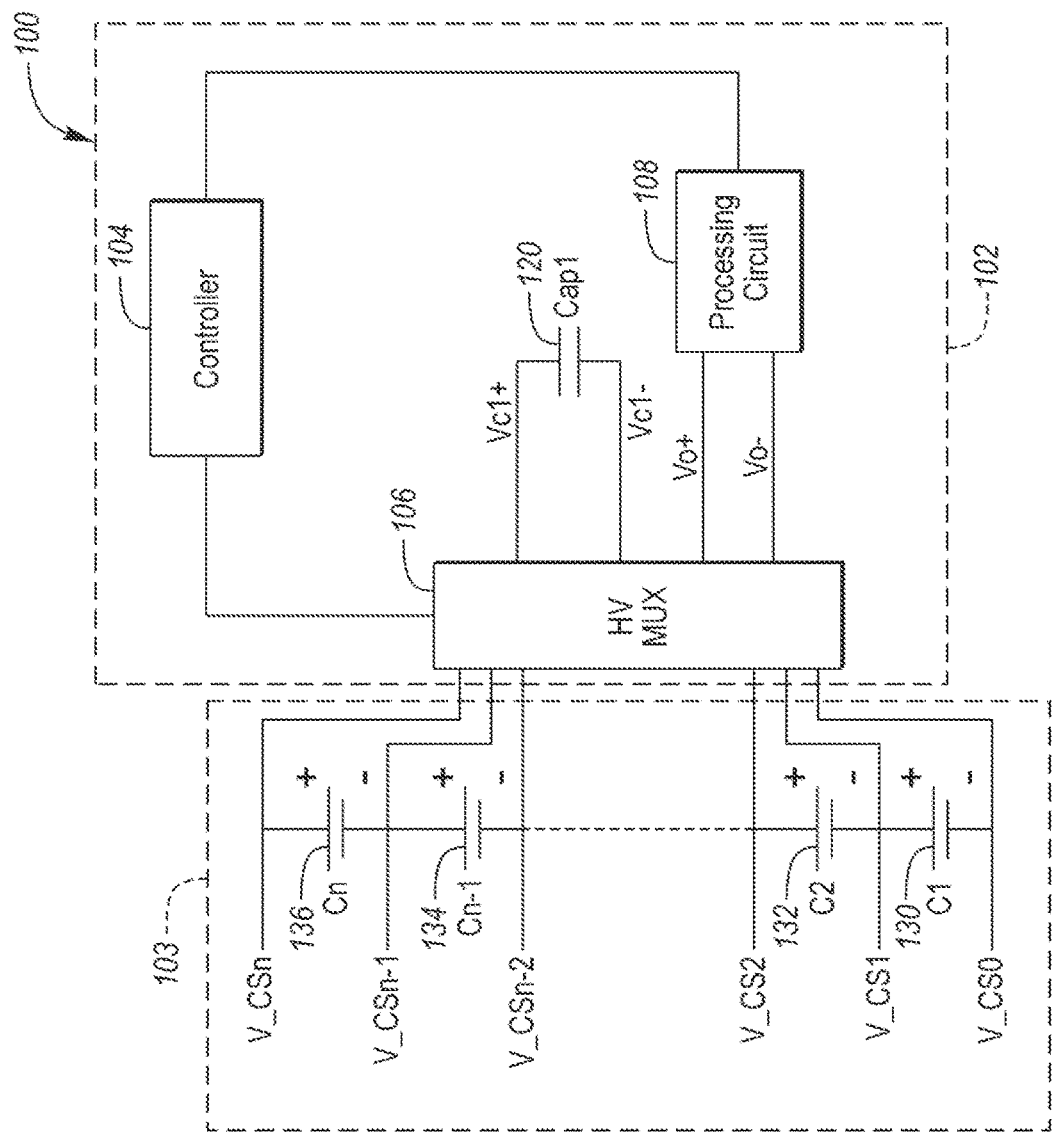
FIG. 2 illustrates an electrical block diagram of a battery monitoring integrated chip ("BMIC") in accordance with an embodiment, the BMIC being a component of a battery energy control module ("BECM") associated with a battery and the BMIC being operably connected to battery cells of the battery.

Referring now to FIG. 2, an electrical block diagram of a battery monitoring integrated chip (BMIC) 102 in accordance with an embodiment is shown. BMIC 102 is a component of an electronic battery energy control module ("BECM") 100. BECM may have other BMICs. When implemented in electric vehicle 10, BECM 100 is a control module of controller 22 and is operable to monitor and control traction battery 14.

BMIC 102 is operably connected to battery cells of a battery pack 103. When implemented in electric vehicle 10, battery pack 103 is traction battery 14. Battery pack 103 includes a plurality of battery cells. For instance, battery pack 103 includes "n" battery cells, where n is an integer greater than one. As an example, as shown in FIG. 2, the battery cells of battery pack 103 include battery cell "C1" 130, battery cell "C2" 132, battery cell "Cn-1" 134, and battery cell "Cn" 136.

BMIC 102 includes a controller 104, at least one switching circuit such as a high-voltage (HV) multiplexer 106, and at least one processing circuit ("processor") 108. BMIC 102 further includes at least one flying capacitor 120. Processor 108 is connected by a pair of terminal lines Vo+ and Vo− to multiplexer 106. Capacitor 120 ("Cap1") is connected by a pair of terminal lines Vc1+ and Vc1− to multiplexer 106.

The battery cells of battery pack 103 are connected in series in a stack. Battery pack 103 includes terminal lines respectively connected to the negative and positive voltage ends of the battery cells. For instance, the terminal line V_CS0 is the negative terminal of battery cell C1, which is the bottom battery cell of battery pack 103. BMIC 102 uses the terminal line V_CS0 as the ground reference. The terminal line V_CS1 is the positive terminal of battery cell C1 and is the negative terminal of battery cell C2. The terminal line V_CS2 is the positive terminal of battery cell C2 and so on. The terminal line V_CSn is the positive terminal of Cn, which is the top battery cell of battery pack 103. The terminal lines of battery pack 103 are individually connected to multiplexer 106 for BMIC 102 to be operably connected to the battery cells of battery pack 103.

Multiplexer 106 is operable to perform switching to connect terminal lines of battery cells of battery pack 103 and of processor 108 and capacitor 120 of BMIC 102. Controller 104 controls the switching of multiplexer 106 and monitors processing of processor 108 for BMIC 102 to measure voltage differences between the battery cells of battery pack 103.

Particularly, BMIC 102 uses capacitor 120 to measure the voltage differences between the battery cells of battery pack 103. The operation of using capacitor 120 to measure the voltage difference between two battery cells such as, for example, battery cell C2 and battery cell Cn, will be explained with reference to FIGS. 3A and 3B.

Figure 3A:
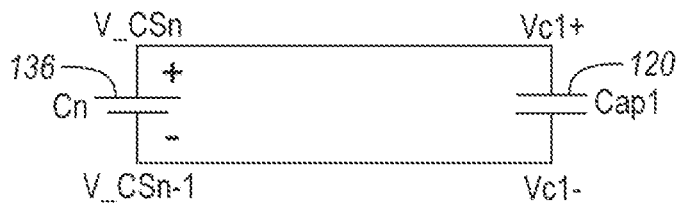
FIG. 3A illustrates an electrical schematic diagram depicting battery cell Cn of the battery being connected in parallel to the capacitor of the BMIC during an initial operation step of the BMIC for measuring a voltage difference between battery cell C2 of the battery and battery cell Cn.

FIG. 3A illustrates an electrical schematic diagram depicting an initial operation step of BMIC 102 for measuring the voltage difference between battery cell C2 and battery cell Cn. At the beginning of the initial operation step, capacitor 120 is either fully discharged or holding a certain amount of charge. Thereafter, controller 104 controls multiplexer 106 to connect the positive and negative terminal lines V_CSn and V_CSn-1 of battery cell Cn to the positive and negative terminal lines Vc1+ and Vc1− of capacitor 120, respectively. As such, battery cell Cn is connected in parallel to capacitor 120. Consequently, capacitor 120 is charged to the voltage of battery cell Cn. For example, the voltage of battery cell Cn is 4.1 volts and therefore capacitor 120 is charged to 4.1 volts.

Figure 3B:
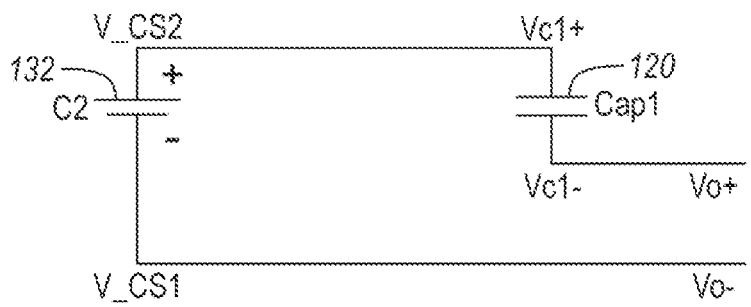
FIG. 3B illustrates an electrical schematic diagram depicting battery cell C2 being connected in series with the capacitor of the BMIC, after the capacitor has been charged to the voltage of battery cell Cn, with the negative terminal of the capacitor and the negative terminal of battery cell C2 being respectively connected to the terminal lines Vo+ and Vo− connected to the processor of the BMIC during a final operation step of the BMIC for measuring the voltage difference between battery cell C2 and battery cell Cn.

FIG. 3B illustrates an electrical schematic diagram depicting a final operation step of BMIC 102 for measuring the voltage difference between battery cell C2 and battery cell Cn. At the beginning of the final operation step (i.e., at the end of the initial operation step), capacitor 120 has been charged to the voltage of battery cell Cn. Thereafter, controller 104 controls multiplexer 106 to connect positive terminal line V_CS2 of battery cell C2 to positive terminal line Vc1+ of capacitor 120, negative terminal Vc1− of capacitor 120 to terminal line Vo+, and negative terminal V_CS1 of battery cell C2 to terminal line Vo−. As such, battery cell C2 and capacitor 120 are connected in series with their negative terminals respectively connected to terminal lines Vo− and Vo+. As such, battery cell C2 and capacitor 120 form a series circuit in which the negative terminal of the capacitor 120 is the positive output of the circuit and the negative terminal of the battery cell C2 is the negative output of the circuit.

Consequently, the differential voltage between terminal lines Vo+ and Vo− is equal to the voltage difference between battery cell C2 and battery cell Cn. Namely, the voltage difference ($\Delta V$)=the voltage of battery cell C2−the voltage of battery cell Cn. For example, the voltage of battery cell C2 is 4.5 volts and the voltage of battery cell Cn, as previously given, is 4.1 volts. Thus, the voltage difference between battery cell C2 and battery cell Cn ($\Delta V$)=4.5 volts−4.1 volts=0.4 volts.

Terminal lines Vo− and Vo+ are connected to processor 108. Processor 108 can thus measure the differential voltage between terminal lines Vo+ and Vo−, which is the voltage difference between battery cell C2 and battery cell Cn. Processor 108 measures this voltage difference between battery cell C2 and battery cell Cn to conclude the operation for measuring the voltage difference between battery cell C2 and battery cell Cn.

Further, after the initial operation step, controller 104 can instead control multiplexer 106 to connect the positive and negative terminal lines Vc1+ and Vc1− of capacitor 120 respectively to terminal lines Vo+ and Vo−. As capacitor 120 is charged to the voltage of battery cell Cn after the initial operation step, processor 108 then measures the voltage of capacitor 120 to determine the absolute voltage of battery cell Cn.

The operation of using capacitor 120 to measure the voltage difference between a pair of battery cells of battery pack 103 can be repeated for any pair of the battery cells. In this way, BMIC 102 can measure the voltage differences between battery cells of any or all possible pairing combinations of the battery cells.

Of course, the above-mentioned circuit configurations of BMIC 102 can be implemented by many different componentry, e.g., HVMUX, HVMUX and external switches, etc. BMIC 102 using flying capacitor 120 to measure the voltage difference between a given pair of battery cells is not limited to any specific circuit implementation componentry. BMIC 102 may include one or more additional flying capacitors, similarly arranged as capacitor 120, to use in measuring voltage differences between the battery cells.

As described herein throughout, BMIC 102 may be a low cost BMIC in the sense that the BMIC has a low-resolution analog-to-digital converter (ADC). BMIC 102 may have an auto ranging amplifier to fully utilize the full-scale range (FSR) of such low-resolution ADC. In this regard, the auto ranging amplifier provides the requisite amplification during the normal situations in which the voltage difference between battery cells is a few millivolts and in the abnormal situations in which the voltage difference between battery cells is relatively large.

To measure voltage differences with a low-resolution ADC, an auto-ranging amplifier is used for the input signal. When the voltage difference between battery cells is such a low voltage, the accuracy can be guaranteed. The operation described with reference to FIGS. 3A and 3B for measuring the voltage difference between any two battery cells of battery pack 103 involves initially using capacitor 120 to hold one battery cell voltage (e.g., the voltage of battery cell Cn). The battery cell voltage held by capacitor 120 is then compared to another battery cell voltage (e.g., the voltage of battery cell C2) to get the voltage difference (e.g., the voltage of battery cell C2—the voltage of battery cell Cn) at the terminal lines Vo+ and Vo−. By using one flying capacitor 120, the next stage circuit to process terminal lines Vo+ and Vo− may need to shift the voltage to different level frequently, leading to circuit complexity.

BMIC 102 may thus be configured with an additional flying capacitor to use two flying capacitors to measure the voltage differences between battery cells. In this way, BMIC 102 can measure the voltage differences without level shifting or suffering from high common mode voltage issue.

The operation of BMIC 102 in using two flying capacitors including a first flying capacitor ("Cap1") (i.e., capacitor 120) and a similarly arranged second capacitor ("Cap2") to measure the voltage difference between two battery cells such as, for example, battery cell C2 and battery cell Cn, will be explained with reference to FIGS. 4A, 4B, and 4C.

Figure 4A:
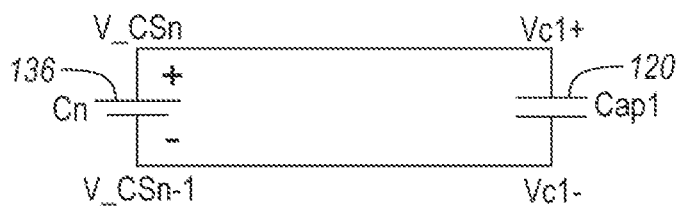
FIG. 4A illustrates an electrical schematic diagram depicting battery cell Cn being connected in parallel to a first capacitor of the BMIC during an initial operation step of the BMIC for measuring a voltage difference between battery cell C2 and battery cell Cn.

FIG. 4A illustrates an electrical schematic diagram depicting an initial operation step of BMIC 102 for measuring a voltage difference between battery cell C2 and battery cell Cn. At the beginning of the initial operation step, both first capacitor Cap1 and second capacitor Cap2 are either fully discharged or holding certain amount of charge. Thereafter, controller 104 controls multiplexer 106 to connect the positive and negative terminal lines V_CSn and V_CSn-1 of battery cell Cn to the positive and negative terminal lines Vc1+ and Vc1− of first capacitor Cap1, respectively. As such, battery cell Cn is connected in parallel to first capacitor Cap1. Consequently, first capacitor Cap1 is charged to the voltage of battery cell Cn.

Figure 4B:
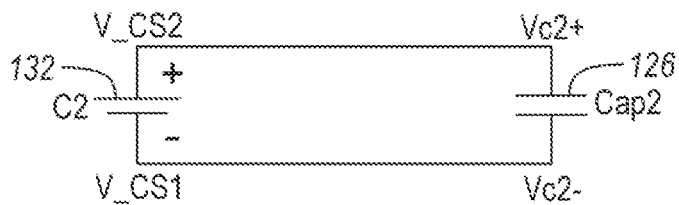
FIG. 4B illustrates an electrical schematic diagram depicting battery cell C2 being connected in parallel to a second capacitor of the BMIC during the initial operation step of the BMIC for measuring the voltage difference between battery cell C2 and battery cell Cn.

FIG. 4B illustrates an electrical schematic diagram further depicting the initial operation step of BMIC 102 for measuring the voltage difference between battery cell C2 and battery cell Cn. Controller 104 controls multiplexer 106 to connect the positive and negative terminal lines V_CS2 and V_CS1 of battery cell C2 to the positive and negative terminal lines Vc2+ and Vc2− of second capacitor Cap2, respectively. As such, battery cell C2 is connected in parallel to second capacitor Cap2. Consequently, second capacitor Cap2 is charged to the voltage of battery cell C2.

Figure 4C:
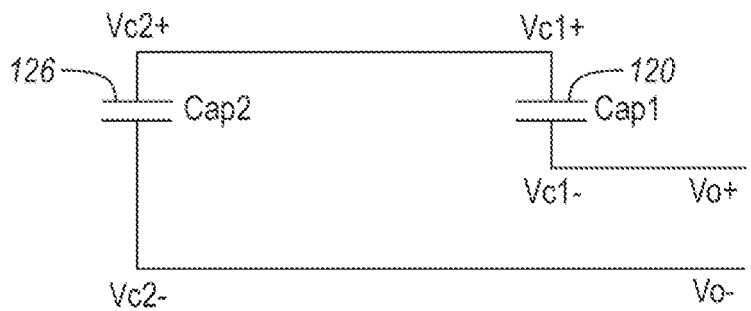
FIG. 4C illustrates an electrical schematic diagram depicting the second capacitor and the first capacitor, after the capacitors have been respectively charged to the voltages of battery cell C2 and battery cell Cn, being connected in series with the negative terminals of the first capacitor and the second capacitor being respectively connected to the terminal lines Vo+ and Vo− connected to the processor of the BMIC during a final operation step of the BMIC for measuring the voltage difference between battery cell C2 and battery cell Cn.

FIG. 4C illustrates an electrical schematic diagram depicting a final operation step of BMIC 102 for measuring the voltage difference between battery cell C2 and battery cell Cn. At the beginning of the final operation step, first capacitor Cap1 has been charged to the voltage of battery cell Cn and second capacitor C2 has been charged to the voltage of battery cell C2. Thereafter, controller 104 controls multiplexer 106 to connect positive terminal line Vc2+ of second capacitor Cap2 to positive terminal line Vc1+ of first capacitor Cap1, negative terminal Vc1− of first capacitor Cap1 to terminal line Vo+, and negative terminal Vc2− of second capacitor Cap2 to terminal line Vo−. As such, second capacitor Cap2 and first capacitor Cap1 are connected in series with their negative terminals respectively connected to terminal lines Vo− and Vo+. Second capacitor Cap2 and first capacitor Cap 1 form a series circuit in which the negative terminal of first capacitor Cap 1 is the positive output of the circuit and the negative terminal of second capacitor Cap2 is the negative output of the circuit.

Consequently, the differential voltage between terminal lines Vo+ and Vo− is equal to the voltage difference between the voltage of battery cell C2 (i.e., the voltage held by second capacitor Cap2) and the voltage of battery cell Cn (i.e., the voltage held by first capacitor Cap1). Processor 108 measures this voltage difference between battery cell C2 and battery cell Cn to conclude the operation for measuring the voltage difference between battery cell C2 and battery cell Cn. Either terminal line Vo+ or terminal line Vo− can be tied to the same reference as processor 108 to measure the voltage difference. This design avoids the level shifting issues.

Further, after the initial operation step, controller 104 can instead control multiplexer 106 to connect the positive and negative terminal lines Vc1+ and Vc1− of first capacitor Cap1 respectively to terminal lines Vo+ and Vo−. As first capacitor Cap1 is charged to the voltage of battery cell Cn after the initial operation step, processor 108 can then measure the voltage of first capacitor Cap1 to determine the absolute voltage of battery cell Cn.

Likewise, after the initial operation step, controller 104 can instead control multiplexer 106 to connect the positive and negative terminal lines Vc1+ and Vc1− of second capacitor Cap2 respectively to terminal lines Vo+ and Vo−. As second capacitor Cap2 is charged to the voltage of battery cell C2 after the initial operation step, processor 108 can then measure the voltage of second capacitor Cap2 to determine the absolute voltage of battery cell C2.

As described, the operations of BMIC 102 described with reference to FIGS. 3A and 3B and with reference to FIGS. 4A, 4B, and 4C can not only measure battery cell voltage differences via flying capacitor(s) but can also measure the absolute battery cell voltages via the flying capacitor(s). More than two flying capacitors can be incorporated in BMIC 102 to hold more battery cell voltages. The similar idea can then be applied to measure battery cell voltage differences and absolute battery cell voltages.

As described, multiplexer 106, processor 108, and flying capacitor(s) 120 function as a battery cell voltage difference measurement circuit of BMIC 102. However, BMIC 102 is not limited to one such battery cell voltage difference measurement circuit. BMIC 102 may include additional identical battery cell voltage difference measurement circuits to increase the number of battery cells managed by one BMIC.

In general, the battery cells of battery pack 103 are to have a similar absolute voltage. Well maintained battery pack 103 is not to allow too large voltage variations between the battery cells. For instance, the battery cells are to have a voltage of around 4.5 volts. Voltage differences between the battery cells is to be on the order of millivolts. In this case, to measure the absolute voltages of the battery cells, the full-scale range (FSR) is around 5.0 volts as the absolute voltage for any of the battery cells is normally no more than 5.0 volts. As such, the FSR can be significantly reduced when measuring the voltage differences between the battery cells (on the order of millivolts) instead of the absolute voltages of the battery cells (on the order of 0 to 5 volts).

Thus, as described, the present disclosure provides a low cost BMIC as the BMIC measures the voltage differences of battery cells. The BMIC measures battery cell voltage differences by using one (or multiple) flying capacitors instead of traditional subtractor circuit consisting of accurate passive components and op-amps. Measuring battery cell voltage differences lowers the resolution requirements of the ADC(s) of the BMIC and lowers the accuracy requirements of the voltage references of the BMIC. The voltage references of the BMIC may even be able to be removed. Other related circuits inside the BMIC can be relaxed/eliminated. Thus, BMICs according to the present disclosure can be low cost as the BMICs may use a low-resolution ADC and may use low accuracy voltage references (or not voltage references at all). Consequently, the cost of a BECM having multiple low cost BMICs according to the present disclosure remains relatively low. Further, such low cost BMICs according to the present disclosure can even be used to measure the absolute battery cell voltages.

Figure 5:
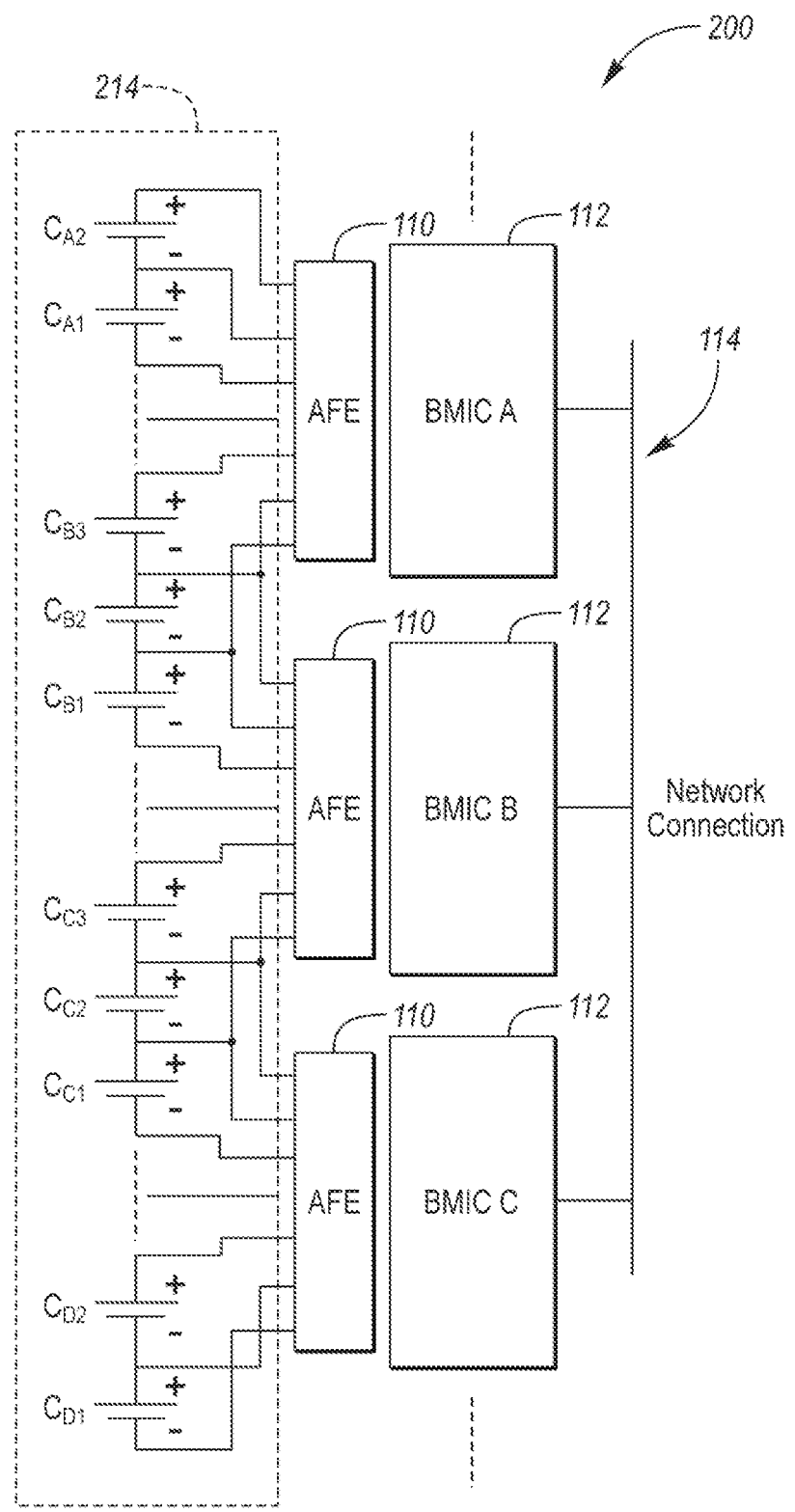
FIG. 5 illustrates an electrical block diagram of a BECM having multiple BMICs in accordance with an embodiment, the BMICs being operably connected to battery cells of a battery.

Referring now to FIG. 5, an electrical block diagram of a BECM 200 having multiple BMICs 112 in accordance with an embodiment is shown. When implemented in electric vehicle 10, BECM 200 is a control module of controller 22 and is operable to monitor and control traction battery 14. BMICs 112 are operably connected to battery cells of a battery pack 214. When implemented in electric vehicle 10, battery pack 214 is traction battery 14.

BECM 200 includes multiple BMICs 112 as one BMIC is not enough to cover all the battery cells. BMICs 112 are configured the same as BMIC 102 shown in FIG. 2 with either first flying capacitor Cap1 only, first and second flying capacitors Cap1 and Cap2, or first and second flying capacitors Cap1 and Cap2 and one or more additional flying capacitors.

BMICs 112 are associated with respective analog front-ends ("AFEs") 110. BMICs 112 are further connected to a network connection 114 to communicate with one another and with other systems/controllers/devices/etc. (not shown).

BMICs 112 are configured to have overlap of battery cell voltage monitoring. Particularly, one or more battery cells is overlapped between adjacent pairs of BMICs 112 as a reference from one of the BMICs to the other one of the BMICs. Battery cell voltage difference relationships are built across BMICs 112 by controller 104. Overlapping the one or more battery cells between adjacent pairs of BMICs 112 enables more reliable voltage differences entirely across the battery.

The electrical block diagram of FIG. 5 demonstrates the basic idea of overlapping battery cell monitoring between adjacent BMICs 112. For instance, as shown, battery cell $C_{B2}$ is shared by BMIC A and BMIC B. Battery cell $C_{B2}$ is the top battery cell of BMIC B and is the bottom battery cell of BMIC A. Similarly, as shown, battery cell $C_{C2}$ is shared by BMIC B and BMIC C. Battery cell $C_{C2}$ is the top battery cell of BMIC C and is the bottom battery cell of BMIC B.

As described, any BMIC 112 can measure the voltage difference between any pair of battery cells connected to that BMIC.

Further, any two BMICs 112 can measure the voltage difference between one battery cell connected to one of the two BMICs and another battery cell connected to the other one of the two BMICs. In one way, the overlapped battery cells between two BMICs are employed for the two BMICs 112 to measure the voltage difference between one battery cell connected to one of the two BMICs and another battery cell connected to the other one of the two BMICs. For example, assume the voltage difference between battery cell $C_{A2}$, connected to BMIC A, and battery cell $C_{B1}$, connected to BMIC B is to be measured. In this case, BMIC A measures the voltage difference between battery cell $C_{A2}$ and battery cell $C_{B2}$, in which battery cell $C_{B2}$ overlaps both BMIC A and BMIC B; and BMIC B measures the voltage difference between battery cell $C_{B1}$ and the overlapping battery cell $C_{B2}$. The (i) voltage difference between battery cell $C_{A2}$ and overlapping battery cell $C_{B2}$ and the (ii) voltage difference between battery cell $C_{B1}$ and the overlapping battery cell $C_{B2}$ can then be processed to determine the voltage difference between battery cell $C_{A2}$ and battery cell $C_{B1}$.

For example, if (i) the voltage difference between battery cell $C_{A2}$ and overlapping battery cell $C_{B2}$ is +0.4 volts and (ii) the voltage difference between battery cell $C_{B1}$ and the overlapping battery cell $C_{B2}$ is +0.1 volts, then (iii) the voltage difference between battery cell $C_{A2}$ and battery cell $C_{B1}$ is: 0.4 volts–0.1 volts=0.3 volts.

BMICs 112 are low cost BMICs as described herein. However, one (or more) BMICs 112 may be a high cost BMIC having a high-resolution ADC and an accurate voltage reference. For instance, BMIC C may be a high cost BMIC. In turn, BMIC C may accurately measure the absolute voltages of battery cells connected to BMIC C. For instance, BMIC C may directly measure the absolute voltage of battery cell $C_{C2}$. BMIC C may then measure the voltage difference between another battery cell $C_{C1}$ and battery cell $C_{C2}$, per the operations described herein. BMIC C may then measure the absolute voltage of battery cell $C_{C1}$ as being the sum of (i) the voltage difference between battery cell $C_{C1}$ and battery cell $C_{C2}$, measured by BMIC C, and (ii) the absolute voltage of battery cell $C_{C2}$, also measured by BMIC C. Alternatively, BMIC C can directly measure the absolute voltage of battery cell $C_{C2}$.

Further, as battery cell $C_{C2}$ is shared by (the low cost) BMIC B and (the high cost) BMIC C, BMIC B may likewise measure the voltage difference between battery cell $C_{B1}$, connected to BMIC B, and battery cell $C_{C2}$, also connected to BMIC B, per the operations described herein. BMIC C may then measure the absolute voltage of battery cell $C_{B1}$ as being the sum of (i) the voltage difference between battery cell $C_{C1}$ and battery cell $C_{C2}$, measured by (low cost) BMIC B, and (ii) the absolute voltage of battery cell $C_{C2}$, measured by (high cost) BMIC C.

These operations can be repeated to measure the voltage differences between any of the battery cells and to measure the absolute voltages of any of the battery cells. The absolute voltage measurements are conducted through one high cost BMIC and multiple low cost BMICs. Consequently, the cost of the BECM, which comprises the high cost BMIC and the multiple low cost BMICs, remains low even though accurate absolute battery cell voltages are obtainable.

Alternatively, all BMICs 112 are low cost BMICs as described herein and an external circuit is employed to accurately measure the absolute voltage of at least one of the battery cells. For instance, sticking with the example above, assume the external circuit directly measures the absolute voltage of battery cell $C_{C2}$. (Low cost) BMIC C may then measure the voltage difference between another battery cell $C_{C1}$ and battery cell $C_{C2}$, per the operations described herein. BMIC C may then measure the absolute voltage of battery cell $C_{C1}$ as being the sum of (i) the voltage difference between battery cell $C_{C1}$ and battery cell $C_{C2}$, measured by BMIC C, and (ii) the absolute voltage of battery cell $C_{C2}$ measured by the external circuit.

The measured voltage differences between battery cells can be used by BECM 200 in controlling the operations of electric vehicle 10. For instance, BECM 200 may be configured to balance the battery cells responsive to a voltage difference(s) between a pair(s) of battery cells measured by a BMIC(s) of BECM 200 being greater than a cell balancing threshold. As another example, BECM 200 may be configured to disconnect battery pack 214 (or a portion thereof) from a load responsive to a voltage difference(s) between a pair(s) of battery cells measured by a BMIC(s) of BECM 200 being greater than a shutdown threshold. The measured voltage differences between battery cells can be also used by BECM 200 or some other vehicle controller for battery cell diagnostics.

Figure 6:
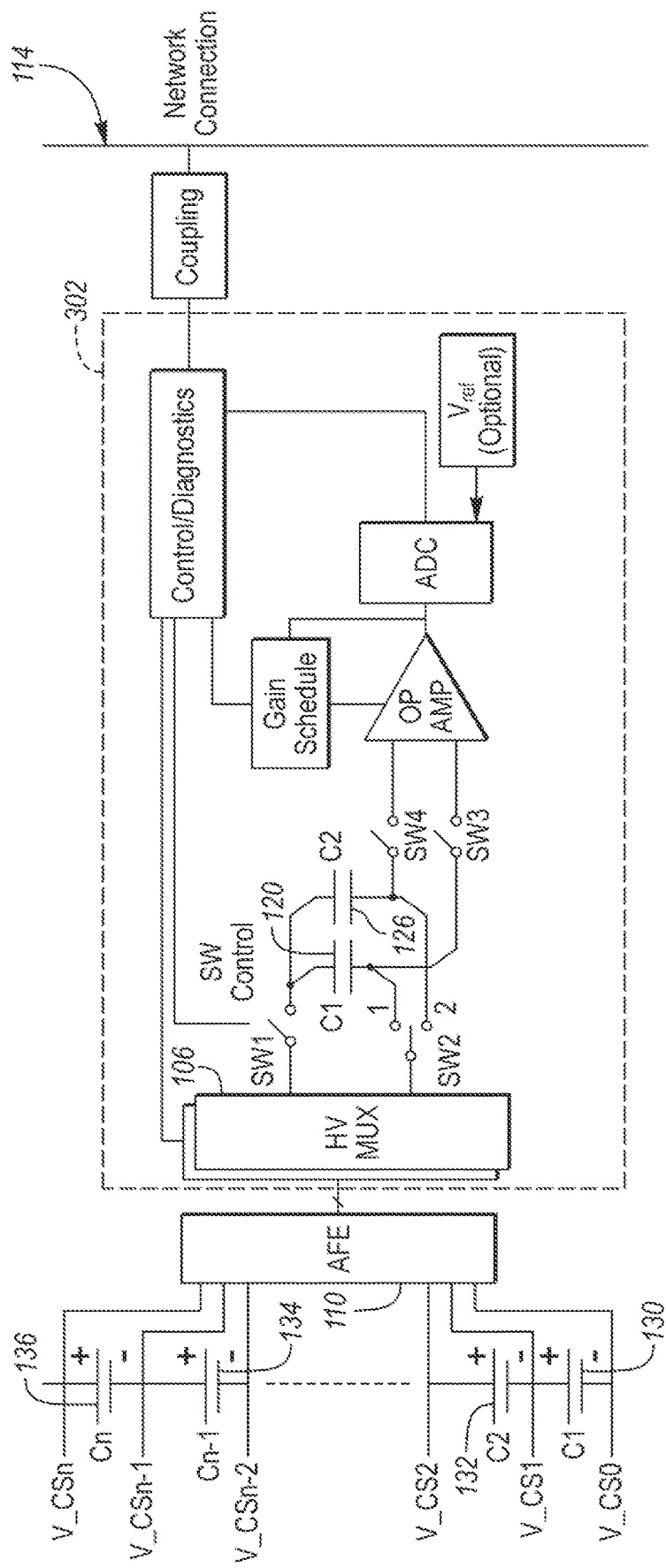
FIG. 6 illustrates an electrical block diagram of a BMIC having two flying capacitors in accordance with an embodiment.

Referring now to FIG. 6, with continual reference to FIGS. 4A, 4B, and 4C, an electrical block diagram of a BMIC 302 having two flying capacitors 120 and 126 in accordance with an embodiment is shown. BMIC 302 is an example of an implementation of two flying capacitors to measure the voltage differences between pairs of battery cells.

The operation of BMIC 302 for measuring the voltage difference between battery cell C2 and battery cell Cn initially involves switches SW1 and SW2-1 being connected across the terminals of battery cell Cn. Consequently, first capacitor Cap1 is charged to the voltage of battery cell Cn. Subsequently, switches SW1 and SW2-2 are connected across the terminals of battery cell C2. Consequently, second capacitor Cap2 is charged to the voltage of battery cell C2. Subsequently, switches SW1 and SW2 are opened and switches SW3 and SW4 are closed. The voltage difference between second capacitor Cap2 and first capacitor Cap1 (i.e., the voltage difference between battery cell C2 and battery cell Cn) can be measured, and no level shift circuit is required.

As described herein, background solutions directly measure absolute battery cell voltage using a high-resolution ADC (usually 14 or 16 bits), an accurate voltage reference, and other supporting circuits. Typically, the high-resolution ADC and the voltage reference need to be trimmed. These all lead to high cost of the BMIC and a higher cost of a BECM incorporating such high cost BMICs.

In accordance with the present disclosure, the battery cell voltage differences are measured using a low-resolution ADC (no more than 10 bits) and a low accuracy voltage reference (or perhaps no voltage reference at all). A calculator can then be used to calculate the absolute battery cell voltages using the measured battery cell voltage differences.

While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A system comprising:
a capacitor;
a processor; and
a controller configured to connect the capacitor in parallel with a cell to charge the capacitor to a voltage of the cell and then connect the capacitor in series with a voltage source to form a circuit having an output that is a voltage difference of the capacitor and the voltage source and connect the output to the processor for the processor to measure the voltage difference.

2. The system of claim 1 wherein:
the cell is a first cell;
the voltage source is a second cell; and
whereby the voltage difference is the voltage difference between the first cell and the second cell.

3. The system of claim 2 wherein:
the processor is configured to measure the voltage of the first cell based in part on the voltage difference between the first cell and the second cell.

4. The system of claim 1 further comprising:
a second capacitor;
wherein the cell is a first cell;
the controller is further configured to connect the second capacitor with a second cell to charge the second capacitor to a voltage of the second cell;
the voltage source is the second capacitor charged to the voltage of the second cell; and
whereby the voltage difference is the voltage difference between the first cell and the second cell.

5. The system of claim 4 wherein:
the processor is configured to measure the voltage of the first cell based in part on the voltage difference between the first cell and the second cell.

6. The system of claim 1 wherein:
the controller is further configured to connect the capacitor, after the capacitor has been charged to the voltage of the cell and prior to the capacitor being connected with the voltage source, to the processor for the processor to measure the voltage of the capacitor and thereby measure the voltage of the cell.

7. The system of claim 1 wherein:
the cell is a battery cell of a traction battery of a vehicle.

8. A system for monitoring battery cells of a battery, comprising:
a first battery monitoring integrated circuit (BMIC) connected to the battery cells of a first portion of the battery;
a second BMIC connected to the battery cells of a second portion of the battery;
wherein the first BMIC includes a first capacitor, a second capacitor, a processor, and a controller, the controller being configured to connect the first capacitor in parallel with a first battery cell connected to the first BMIC to charge the first capacitor to a voltage of the first battery cell and connect the second capacitor in parallel with a second battery cell connected to the first BMIC to charge the second capacitor to a voltage of the second battery cell and then (i) connect the first capacitor in series with the second capacitor to form a circuit having an output that is a voltage difference of the first capacitor and the second capacitor and (ii) connect the output to the processor for the processor to measure the voltage difference, whereby the voltage difference measured by the processor is the voltage difference between the first battery cell and the second battery cell; and
the second BMIC is further connected to a shared one of the battery cells of the first portion of the battery.

9. The system of claim 8 wherein:
the second BMIC includes an analog-to-digital converter (ADC) having a resolution, the second BMIC configured to measure an absolute voltage of any battery cell connected to the BMIC using the ADC; and
the first BMIC lacking any ADC having a resolution greater than the resolution of the ADC of the second BMIC.

10. The system of claim 9 wherein:
the first BMIC is configured to measure the voltage of a given battery cell connected to the first BMIC as being a summation of (i) a voltage difference of the given battery cell and the shared one of the battery cells as measured by the first BMIC and (ii) the absolute voltage of the shared one of the battery cells as measured by the second BMIC.

11. The system of claim 8 wherein:
the controller is further configured to connect the first capacitor, after the first capacitor has been charged to the voltage of the first battery cell and prior to the first capacitor being connected in series with the second capacitor, to the processor for the processor to measure the voltage of the first capacitor and thereby measure the voltage of the first battery cell.

12. The system of claim 8 wherein:
the second BMIC includes a third capacitor, a fourth capacitor, a second processor, and a second controller, the second controller being configured to connect the third capacitor in parallel with a third battery cell connected to the second BMIC to charge the third capacitor to a voltage of the third battery cell and connect the fourth capacitor in parallel with a fourth battery cell connected to the second BMIC to charge the fourth capacitor to a voltage of the fourth battery cell and then (i) connect the third capacitor in series with the fourth capacitor to form a second circuit having a second output that is a voltage difference of the third capacitor and the fourth capacitor and (ii) connect the second output to the second processor for the second processor to measure the voltage difference, whereby the voltage difference measured by the processor is the voltage difference between the third battery cell and the fourth battery cell.

13. A vehicle comprising:
a traction battery; and
a first battery monitoring integrated circuit (BMIC) connected to battery cells of the traction battery, the first BMIC including a capacitor, a processor, and a controller, the controller configured to connect the capacitor in parallel with a first one of the battery cells to charge the capacitor to a voltage of the first one of the battery cells and then connect the capacitor in series with a voltage source to form a circuit having an output that is a voltage difference of the capacitor and the voltage source and connect the output to the processor for the processor to measure the voltage difference.

14. The vehicle of claim 13 wherein:
the voltage source is a second one of the battery cells, whereby the voltage difference is the voltage difference between the first one of the battery cells and the second one of the battery cells.

15. The vehicle of claim 13 wherein:
the capacitor is a first capacitor and the first BMIC further includes a second capacitor; and
the controller is further configured to connect the second capacitor in parallel with a second one of the battery cells to charge the second capacitor to a voltage of the second one of the battery cells and then connect the first capacitor in series with the second capacitor to form a circuit having an output that is a voltage difference of the first capacitor and the second capacitor and connect the output to the processor for the processor to measure the voltage difference, whereby the voltage difference is the voltage difference between the first one of the battery cells and the second one of the battery cells.

16. The vehicle of claim 13 further comprising:
a second BMIC connected to a given one of the battery cells, wherein the second BMIC includes an analog-to-digital converter (ADC) having a resolution, the second BMIC configured to measure an absolute voltage of the given one of the battery cells using the ADC; and
the first BMIC lacking any ADC having a resolution greater than the resolution of the ADC of the second BMIC.

17. The vehicle of claim 16 wherein:
the first BMIC is configured to measure the voltage of the first one of the battery cells as being a summation of (i) a voltage difference of the first one of the battery cells and the given one of the battery cells as measured by the first BMIC and (ii) the absolute voltage of the given one of the battery cells as measured by the second BMIC.

18. The vehicle of claim 13 wherein:
the controller is further configured to connect the capacitor, after the capacitor has been charged to the voltage of the first one of the battery cells and prior to the capacitor being connected in series with the voltage source, to the processor for the processor to measure the voltage of the capacitor and thereby measure the voltage of the cell.

19. The vehicle of claim 13 wherein:
the first BMIC is configured to, responsive to the voltage difference being greater than a cell balancing threshold, balance the battery cells of the battery.

20. The vehicle of claim 13 further comprising:
a vehicle controller configured to, responsive to the voltage difference being greater than a shutdown threshold, disconnect the battery from a load.

* * * * *